United States Patent
Coleman et al.

(10) Patent No.: US 7,477,194 B2
(45) Date of Patent: Jan. 13, 2009

(54) CONDUCTIVE PATTERN AND METHOD OF MAKING

(75) Inventors: James P. Coleman, Maryland Heights, MO (US); Scott Wayne Ferguson, Arcadia, CA (US); Jaime C. Grunlan, Pasadena, CA (US); Ian J. Forster, Chelmsford (GB); Andrew W. Holman, West Hills, CA (US); Peikang Liu, Claremont, CA (US)

(73) Assignee: Avery Dennison Corporation, Pasadena, CA (US)

( * ) Notice: Subject to any disclaimer, the term of this patent is extended or adjusted under 35 U.S.C. 154(b) by 119 days.

(21) Appl. No.: 11/294,039

(22) Filed: Dec. 5, 2005

(65) Prior Publication Data

US 2006/0076422 A1    Apr. 13, 2006

Related U.S. Application Data

(62) Division of application No. 10/412,794, filed on Apr. 11, 2003.

(51) Int. Cl.
 *H01Q 1/38* (2006.01)
(52) U.S. Cl. .................. 343/700 MS; 343/895
(58) Field of Classification Search .......... 343/700 MS, 343/702, 718, 895, 795
See application file for complete search history.

(56) References Cited

U.S. PATENT DOCUMENTS

| | | | |
|---|---|---|---|
| 2,702,123 A | 2/1955 | Injeski, Jr. | |
| 3,324,014 A | 6/1967 | Modjeska | |
| 4,053,370 A | 10/1977 | Yamashita et al. | |
| 4,159,222 A | 6/1979 | Lebow et al. | |
| 4,323,441 A | 4/1982 | Schaer et al. | |
| 4,357,395 A | 11/1982 | Lifshin et al. | |
| 4,455,181 A | 6/1984 | Lifshin et al. | |
| 4,462,873 A | 7/1984 | Watanabe | |
| 4,525,416 A | 6/1985 | Hammerschmidt et al. | |
| 4,597,836 A | 7/1986 | Schaer et al. | |

(Continued)

FOREIGN PATENT DOCUMENTS

EP    0 896 706    6/2000

(Continued)

OTHER PUBLICATIONS

E.W. Brooman et al. A New Manufacturing Technique for Flexible Circuitry, Electronic Packaging & Production, vol. 21, (Aug. 1981), pp. 147, 148, 150, 152, and 154-156.

(Continued)

*Primary Examiner*—HoangAnh T Le

(57) ABSTRACT

A method of forming an electrically-conductive pattern includes selectively electroplating the top portions of a substrate that corresponds to the pattern, and separating the conductive pattern from the substrate. The electroplating may also include electrically connecting the conductive pattern to an electrical component. Conductive ink, such as ink including carbon particles, may be selectively placed on the conductive substrate to facilitate plating of the desired pattern and/or to facilitate separation of the pattern from the substrate. An example of a conductive pattern is an antenna for a radio-frequency identification (RFID) device such as a label or a tag. One example of an electrical component that may be electrically connected to the antenna, is an RFID strap or chip.

17 Claims, 6 Drawing Sheets

U.S. PATENT DOCUMENTS

| | | | |
|---|---|---|---|
| 4,789,438 A | 12/1988 | Polan | |
| 4,790,902 A | 12/1988 | Wada et al. | |
| 4,889,584 A | 12/1989 | Wada et al. | |
| 5,049,221 A * | 9/1991 | Wada et al. | 156/151 |
| 5,096,522 A | 3/1992 | Kawachi et al. | |
| 5,153,983 A | 10/1992 | Oyama | |
| 5,158,604 A | 10/1992 | Morgan et al. | |
| 5,316,974 A | 5/1994 | Crank | |
| 5,437,916 A | 8/1995 | Morgan et al. | |
| 5,541,570 A | 7/1996 | McDowell | |
| 5,545,291 A | 8/1996 | Smith et al. | |
| 5,564,888 A | 10/1996 | Doan | |
| 5,621,199 A | 4/1997 | Calari et al. | |
| 5,783,856 A | 7/1998 | Smith et al. | |
| 5,824,186 A | 10/1998 | Smith et al. | |
| 5,854,480 A | 12/1998 | Noto | |
| 5,886,877 A | 3/1999 | Shingai et al. | |
| 5,904,545 A | 5/1999 | Smith et al. | |
| 5,939,984 A * | 8/1999 | Brady et al. | 340/572.1 |
| 5,969,422 A | 10/1999 | Ting et al. | |
| 6,001,211 A | 12/1999 | Hiroyuki | |
| 6,107,920 A | 8/2000 | Eberhardt et al. | |
| 6,133,070 A | 10/2000 | Yagi et al. | |
| 6,145,901 A | 11/2000 | Rich | |
| 6,147,605 A | 11/2000 | Vega et al. | |
| 6,172,609 B1 | 1/2001 | Lu et al. | |
| 6,204,764 B1 | 3/2001 | Maloney | |
| 6,206,292 B1 | 3/2001 | Robertz et al. | |
| 6,210,537 B1 | 4/2001 | Murphy et al. | |
| 6,236,316 B1 | 5/2001 | Eberhardt et al. | |
| 6,239,983 B1 | 5/2001 | Shingai et al. | |
| 6,246,327 B1 | 6/2001 | Ebrehardt | |
| 6,259,408 B1 * | 7/2001 | Brady et al. | 343/700 MS |
| 6,262,292 B1 | 7/2001 | Yasuda et al. | |
| 6,265,977 B1 * | 7/2001 | Vega et al. | 340/572.7 |
| 6,271,793 B1 * | 8/2001 | Brady et al. | 343/700 MS |
| 6,274,508 B1 | 8/2001 | Jacobsen et al. | |
| 6,281,038 B1 | 8/2001 | Jacobsen et al. | |
| 6,291,896 B1 | 9/2001 | Smith | |
| 6,316,278 B1 | 11/2001 | Jacobsen et al. | |
| 6,350,957 B1 | 2/2002 | Shingai et al. | |
| 6,378,199 B1 | 4/2002 | Yoshinuma et al. | |
| 6,380,729 B1 | 4/2002 | Smith | |
| 6,384,727 B1 | 5/2002 | Diprizio et al. | |
| 6,392,544 B1 | 5/2002 | Collins et al. | |
| 6,407,665 B2 | 6/2002 | Maloney | |
| 6,417,025 B1 | 7/2002 | Gengel | |
| 6,451,154 B1 | 9/2002 | Grabau et al. | |
| 6,476,775 B1 | 11/2002 | Oberle | |
| 6,582,887 B2 * | 6/2003 | Luch | 430/311 |
| 6,664,169 B1 | 12/2003 | Iwasaki et al. | |
| 6,933,892 B2 | 8/2005 | Oberle | |
| 6,940,408 B2 * | 9/2005 | Ferguson et al. | 340/572.7 |
| 6,951,602 B1 | 10/2005 | Reuter et al. | |
| 2001/0006368 A1 | 7/2001 | Maloney | |
| 2001/0054755 A1 | 12/2001 | Kirkham | |
| 2002/0035701 A1 | 3/2002 | Casebolt et al. | |
| 2002/0145520 A1 | 10/2002 | Maloney | |
| 2003/0029921 A1 | 2/2003 | Akita et al. | |
| 2004/0090380 A1 | 5/2004 | Luch | |
| 2005/0123857 A1 * | 6/2005 | Luch | 430/311 |
| 2005/0133375 A1 | 6/2005 | Schmid et al. | |
| 2007/0040686 A1 * | 2/2007 | Reis | 340/572.7 |

FOREIGN PATENT DOCUMENTS

| | | |
|---|---|---|
| EP | 1 039 543 | 9/2000 |
| JP | 2003-223626 | 8/2003 |
| JP | 2004-214419 | 7/2004 |
| WO | 82/00541 | 2/1982 |
| WO | 92/21790 | 12/1992 |
| WO | 93/05489 | 3/1993 |
| WO | 00/16277 | 3/2000 |
| WO | 00/16280 | 3/2000 |
| WO | 00/41148 | 7/2000 |
| WO | 01/73864 | 4/2001 |
| WO | 01/50547 | 7/2001 |
| WO | 01/71686 | 9/2001 |
| WO | 01/80174 | 10/2001 |
| WO | 03/056509 | 7/2003 |
| WO | 2004/038793 | 9/2004 |
| WO | 2004/080139 | 9/2004 |
| WO | WO 2005/056881 | 6/2005 |

OTHER PUBLICATIONS

G.R. Schaer et al. Some Commercial Applications of Hi-Speed Electrodeposition, Summer National AICHE Meeting, (Aug. 29-Sep. 1, 1982), Cleveland, Ohio.

Novel Equipment for Electroforming Flexible Circuits, Products Finishing, (Mar. 1981), pp. 90-92.

\* cited by examiner

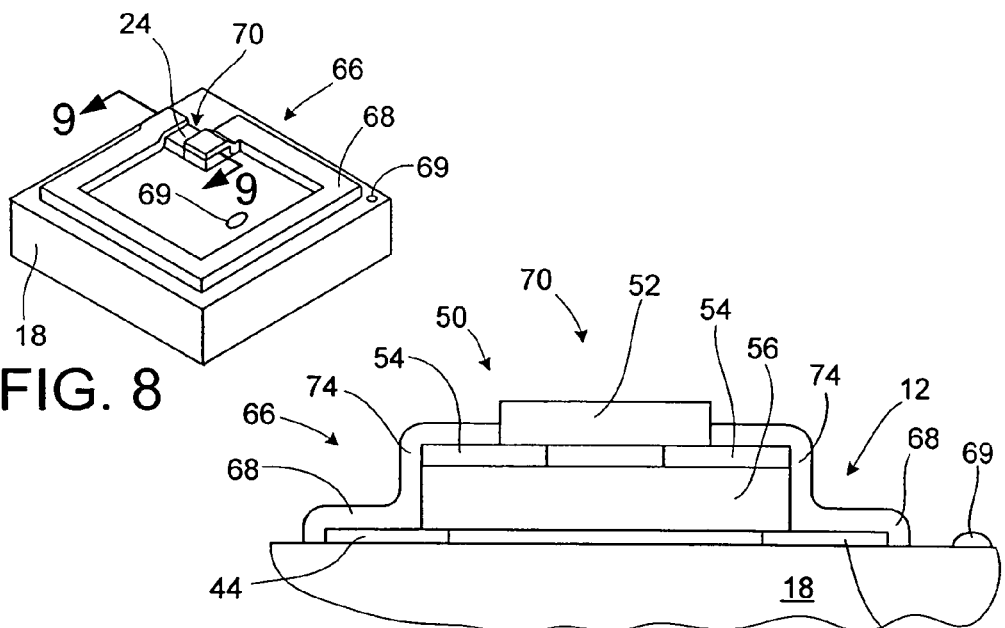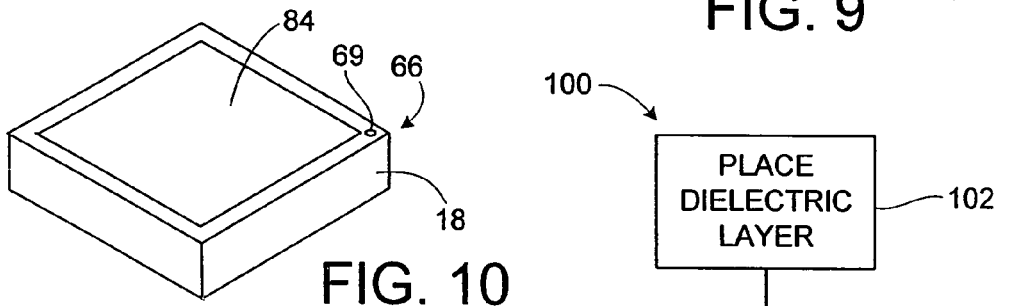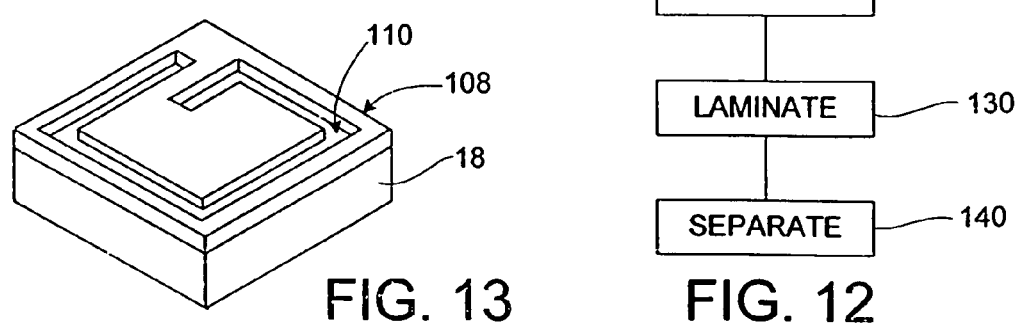

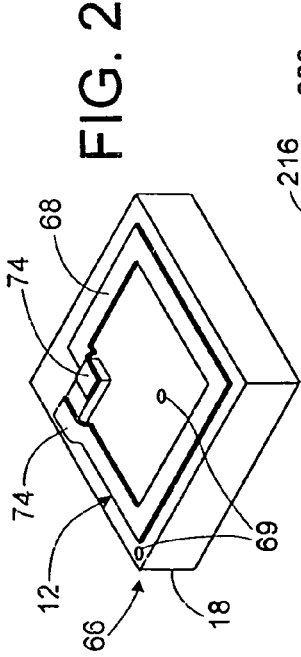
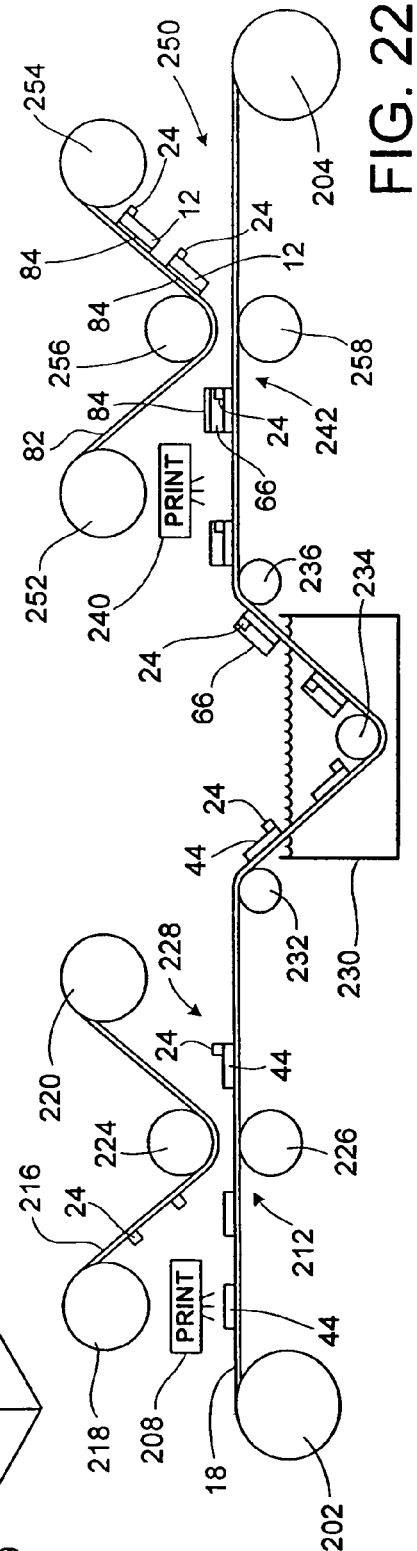
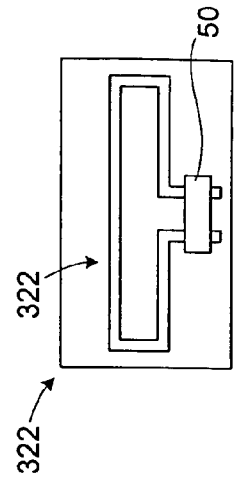
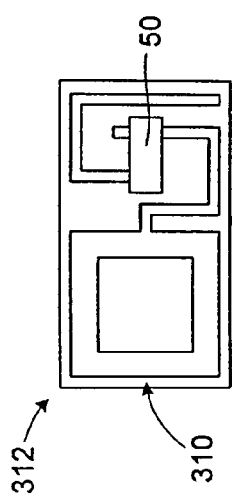
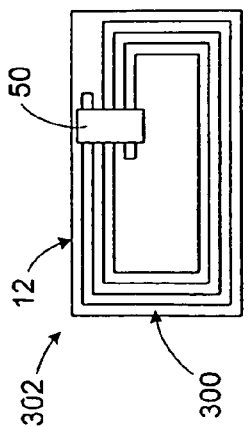
FIG. 21
FIG. 22
FIG. 23
FIG. 24
FIG. 25

CONDUCTIVE PATTERN AND METHOD OF MAKING

This application is a division of pending U.S. application Ser. No. 10/412,794, filed Apr. 11, 2003, which is hereby incorporated by reference in its entirety.

BACKGROUND OF THE INVENTION

1. Field of the Invention

This invention relates to methods and devices for producing patterned conductors (conductive patterns), and for producing device including conductive patterns.

2. Description of the Related Art

One difficult manufacturing challenge is fabrication of patterns of electrically-conductive material, particularly atop dielectric materials. One past method of accomplishing the patterning is to etch a layer of conductive material, such as a metal film. However, etching is an exacting process and can be expensive.

An alternative method has been to deposit conductive ink traces on the dielectric material. However, the inks utilized may be expensive, and problems of continuity of the elements of the conductive pattern may arise when such a method is used.

One field where conductive patterns are employed is that of radio frequency identification (RFID) tags and labels (collectively referred to herein as "devices"). RFID devices are widely used to associate an object with an identification code. RFID devices generally have a combination of antennas (a conductive pattern) and analog and/or digital electronics, which may include for example communications electronics, data memory, and control logic. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,292, all of which are hereby incorporated by reference in their entireties.

As noted above, RFID devices are generally categorized as labels or tags. RFID labels are RFID devices that are adhesively or otherwise have a surface attached directly to objects. RFID tags, in contrast, are secured to objects by other means, for example by use of a plastic fastener, string or other fastening means.

One goal in employment of RFID devices is reduction in the cost of such devices.

From the foregoing it will be appreciated that improvements in conductive pattern fabrication methods would desirable. In particular, improvements in RFID devices utilizing conductive patterns would be desirable.

SUMMARY OF THE INVENTION

According to an aspect of the invention, a conductive pattern is formed by plating atop a conductive substrate.

According to another aspect of the invention, a conductive pattern is formed by plating on a patterned conductive ink layer that includes a carbon-containing ink.

According to yet another aspect of the invention, a method of making a conductive pattern includes the steps of: plating the conductive pattern atop a conductive substrate; and separating the conductive pattern from the conductive substrate.

According to still another aspect of the invention, a method of making a radio frequency identification (RFID) device includes the steps of: plating a conductive pattern atop a conductive substrate, wherein the conductive pattern includes an RFID antenna; coupling the RFID antenna to a separation substrate; and separating the separation substrate and the conductive substrate, thereby separating the RFID antenna from the conductive substrate.

According to a further aspect of the invention, a radio frequency identification (RFID) device includes: an RFID chip; an RFID antenna; and electroplated conductive links providing electrical coupling between the chip and the antenna.

According to a still further aspect of the invention, an RFID device includes electroplated links between one or more components, such as a chip, an energy storage device, and/or a resonator, and an antenna, and/or between different components. The antenna and the links may be parts of a continuous electroplated conductive pattern.

According to another aspect of the invention, a method of producing an RFID device includes the steps of: depositing a patterned conductive ink layer on a substrate; placing an electrical component in contact with the conductive ink layer; and electroplating to form a conductive pattern electrically coupled to the electrical component.

According to yet another aspect of the invention, a method of making a conductive pattern includes the steps of: placing a dielectric layer on a conductive substrate, wherein the dielectric layer has openings therethrough; plating the conductive pattern atop the conductive substrate, through the openings; and separating the conductive pattern from the conductive substrate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale:

FIG. 8 is an oblique view illustrating a third step of the method of FIG. 4;

FIG. 9 is a cross-sectional view along line 9-9 of FIG. 8;

FIG. 10 is an oblique view illustrating a fourth step of the method of FIG. 4;

FIG. 11 is an oblique view illustrating a fifth step of the method of FIG. 4;

FIG. 12 is a flowchart illustrating another example of the method of FIGS. 1 and 3;

FIG. 13 is an oblique view illustrating a first step of the method of FIG. 12;

FIG. 21 is an oblique view illustrating a third step of the method of FIG. 18;

FIG. 22 is a schematic view illustrating a system for carrying out the methods of FIGS. 1 and 3;

FIG. 23 is a plan view of a first RFID device in accordance with the present invention, utilizing a conductive pattern as an antenna;

FIG. 24 is a plan view of a second RFID device in accordance with the present invention, utilizing a conductive pattern as an antenna;

FIG. 25 is a plan view of a third RFID device in accordance with the present invention, utilizing a conductive pattern as an antenna;

DETAILED DESCRIPTION

A method of forming an electrically-conductive pattern includes selectively electroplating the top portions of a conductive substrate that corresponds to the pattern, and separating the conductive pattern from the conductive substrate. The electroplating may also include electrically connecting the conductive pattern to an electrical component. Conductive ink, such as ink including carbon particles, may be selectively placed on the conductive substrate to facilitate plating of the desired pattern and/or to facilitate separation of the pattern from the conductive substrate. An example of a conductive pattern is an antenna for a radio-frequency identification (RFID) device such as a label or a tag. One example of an electrical component that may be electrically connected to the antenna, is an RFID strap or chip.

In the following description, various methods are described for formation of a conductive pattern, and for formation of conductive patterns with electrical connection between the patterns to electrical components. Although reference is made throughout to a particular application of the disclosed fabrication methods, that of RFID devices such as RFID tags or labels, it will be appreciated that the methods may be utilized for creating a wide variety of conductive patterns and electrical components.

Figure 1:
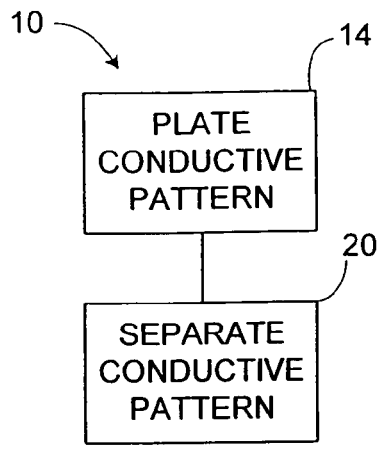
FIG. 1 is a high-level flowchart of a method in accordance with the present invention.
Figure 2:
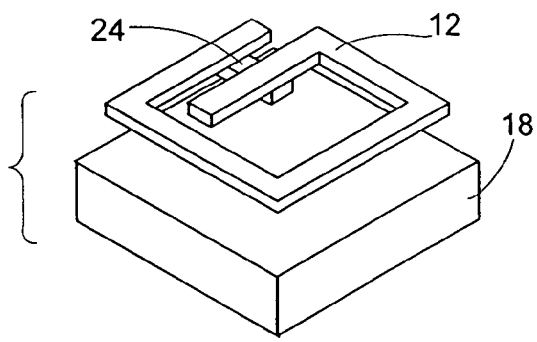
FIG. 2 is an oblique view illustrating the method of FIG. 1.

Referring initially to FIGS. 1 and 2, a method 10 for forming a conductive pattern 12 includes, in step 14, plating the conductive pattern 12 atop a conductive substrate 18. In step 20, the conductive pattern 12 is separated from the conductive substrate 18.

Figure 3:
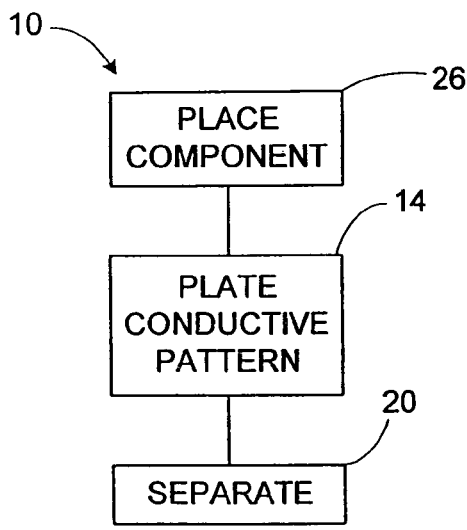
FIG. 3 is a high-level flowchart illustrating an alterative embodiment method in accordance with the present invention.

A possible additional step to the method 10 is illustrated with respect to FIGS. 2 and 3, wherein an electrical component 24 is placed atop the conductive substrate 18 in step 26, prior to step 14's plating to form the conductive pattern 12. Thus, an electrical connection is made between the conductive pattern 12 and the electrical component 24. In the separation of step 20, the electrical component 24 is separated from the conductive substrate 24 along with the conductive pattern 12.

Figure 4:
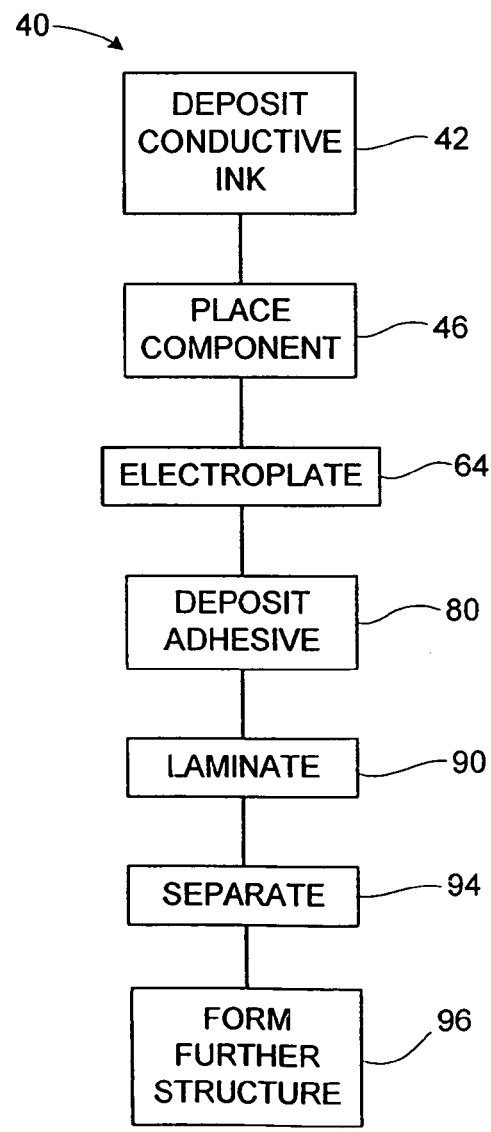
FIG. 4 is a flowchart illustrating a specific embodiment of the methods of FIG. 1 and 3.

A high-level overview of the fabrication methods of the present invention now having been made, details are given regarding several embodiments of the method 10. Turning now to FIG. 4, several steps are shown for one embodiment of the method 10, a method 40 for forming or making a conductive pattern. FIGS. 5-9 illustrate various steps of the method 40.

Figure 5:
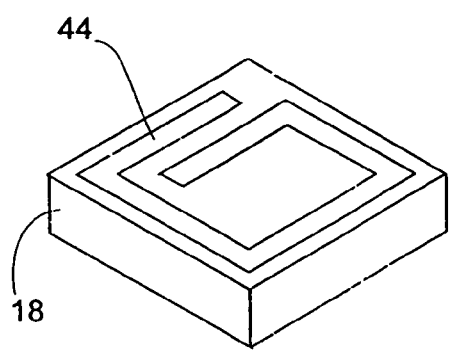
FIG. 5 is an oblique view illustrating a first step in the method of FIG. 4.

In step 42, illustrated in FIG. 5, a patterned conductive ink layer 44 is deposited onto the conductive substrate 18. The conductive substrate 18 may be any of a wide variety of electrically-conductive materials. An example of a suitable conductive material is a metal foil such as an aluminum foil. The rate of plating on the aluminum foil may be a function of the surface roughness of the aluminum. It has been found electroplating proceeds at a lower rate on aluminum having a smooth or shiny surface, for example a polished surface, than on aluminum having a rough or matte surface, for example surface roughened by sanding.

A wide variety of conductive materials may alternatively be used as the material for the conductive substrate 18. Examples of suitable alternative materials include stainless steel and titanium. Other alternative materials that may be suitable include nickel, silver, gold, and copper. Non-metal conductive materials, such as suitable intrinsically conductive polymers may also be utilized in the conductive substrate 18.

The conductive ink used in making the patterned conductive ink layer 44 may be any of a variety of suitable electrically-conductive inks. The conductive ink may include carbon particles or metal particles to make it electrically conductive. One example of an acceptable ink is Acheson 440B ink. Alternatively, black ink for use with regular office inkjet printers may be employed. Generally speaking, it is desirable to have an ink with a high ratio of carbon to polymer binder, so that a high surface area of carbon is achieved. The carbon ink may have a thickness of from about 0.5 to about 20 microns, although it will be appreciated that suitable thicknesses outside that range may be used.

As explained further below, carbon-based ink is desirable in that plating may occur faster on the carbon-based ink than on uncovered or un-inked parts 45 of the conductive substrate 18. Further, carbon-based ink may have a low adhesion to the conductive substrate 18, allowing for easy removal of the carbon-based ink and the overlying plated conductive pattern. It will be appreciated that the preferential plating of material on the carbon-based ink, as opposed to on the un-inked parts 45, may occur only for certain combinations of ink, conductive substrate (material and/or surface properties), and/or plating material.

It will be appreciated that additives may be included in the ink to make the ink easily detachable from the conductive substrate 18. For example, the ink may include wax or other substances having a relatively low melting temperature. Heating of the ink may facilitate removal of the conductive pattern plated on top of the conductive ink layer 44. As an example, the conductive ink may have approximately two parts by weight graphite per part polymer binder or wax. Other additives that may be included in the ink may include polymers with low glass transition temperatures $T_g$, (the temperature at which plastic material will change from the glassy state to the rubbery state). Also, ink with reduced carbon content may be used to facilitate separation of the conductive pattern 12 from the conductive substrate 18.

Of course, a wide variety of other suitable conductive materials may be included in the ink, for example an intrinsically conductive polymer such as polyethylenedioxythiophene (PEDOT), polypyrrole (PPy), or polyaniline (PANI); silver particles; copper particles; nickel particles; or conductive metal oxide particles. More broadly, a wide range of conductive metal powders or conductive metal compound powders may be utilized as additives. It will be appreciated that a high surface area for the conductive particles would be desirable. Generally, however, it will be expected that carbon-based inks may be less expensive than metal-based conductive inks.

It will be appreciated that a variety of suitable non-ink depositable conductive materials may be used as alternatives to or in addition to conductive inks.

A variety of printing methods may be utilized in depositing the patterned conductive ink layer 44, such as screen printing, flexo printing, gravure printing, or inkjet printing.

Figure 6:
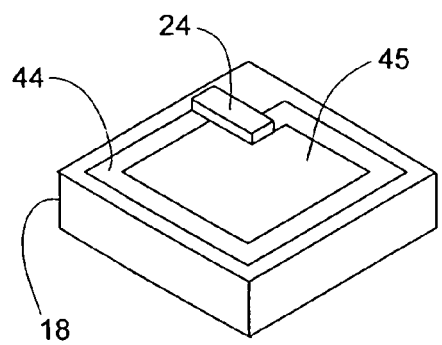
FIG. 6 is an oblique view illustrating a second step in the method of FIG. 4.

In step 46, illustrated in FIG. 6, the electrical component 24 is placed atop the conductive substrate 18, for subsequent electrical connection to the conductive pattern 12. The electrical component 24 may be placed atop parts of the patterned conductive ink layer 44 before the conductive ink layer 44 has dried. Subsequent drying of the conductive ink layer 44 may then serve to adhere the electrical component 24 to the conductive ink layer 44. The adherence between the electrical component 24 and the conductive ink layer 44 may not be a strong, permanent attachment, but may only be sufficient to provide securement during subsequent plating processes.

As an alternative method of securing the electrical component 24 to the conductive ink layer 44 and/or the conductive substrate 18, the electrical component 24 may have an adhesive thereupon, such as a conductive or non-conductive pressure-sensitive adhesive. Pressing the adhesive against the patterned conductive ink layer 44 and/or the conductive substrate 18 secures the electrical component 24 in place. It will be appreciated that many alternative suitable adhesives may be used, for example heat-activated adhesives. It will further be appreciated that alternatively, the adhesive may be placed on the patterned conductive ink layer 44 and/or the conductive substrate 18, with the electrical component 24 then placed upon the adhesive. The adhesive may be deposited by any of a variety of suitable, well-known methods.

Figure 7:
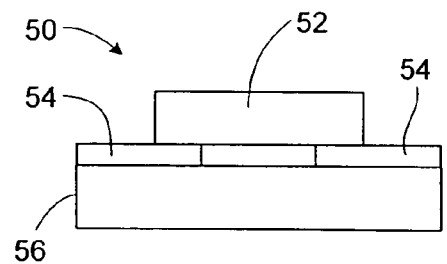
FIG. 7 is a cross-sectional view illustrating an example electrical component used in the method of FIG. 4.

The electrical component 24 may be any of a variety of electrical components to be coupled to, and to perhaps interact with, the conductive pattern 12 to be formed. In one embodiment the conductive pattern 12 may be an antenna and the electrical component 24 may be a radio-frequency identification (RFID) chip or strap to be electrically coupled to the antenna. Examples include an RFID strap available from Alien Technologies, and the strap marketed under the name I-CONNECT, available from Philips Electronics. As shown in FIG. 7, an RFID strap 50 may include an RFID chip 52 (an electronic device for sending and receiving RF signals), conductive leads 54 for making electrical connections to the chip, and an insulating substrate 56 for supporting the conductive leads 54 and the chip 52.

More broadly, the electrical component 24 (FIG. 6) may be any of a variety of RFID devices, including active, passive, or semi-passive RFID devices. An active RFID device is defined as an RFID device that includes its own power source and generates an RF signal. A passive RFID device is defined as an RFID device that does not include its own power source, and which responds to a signal by modulated reflection of the signal. A semi-passive RFID device is defined as an RFID device that includes its own power source, for providing at least part of its power, but which responds to a signal by modulated reflection of the signal.

Figure 7A:
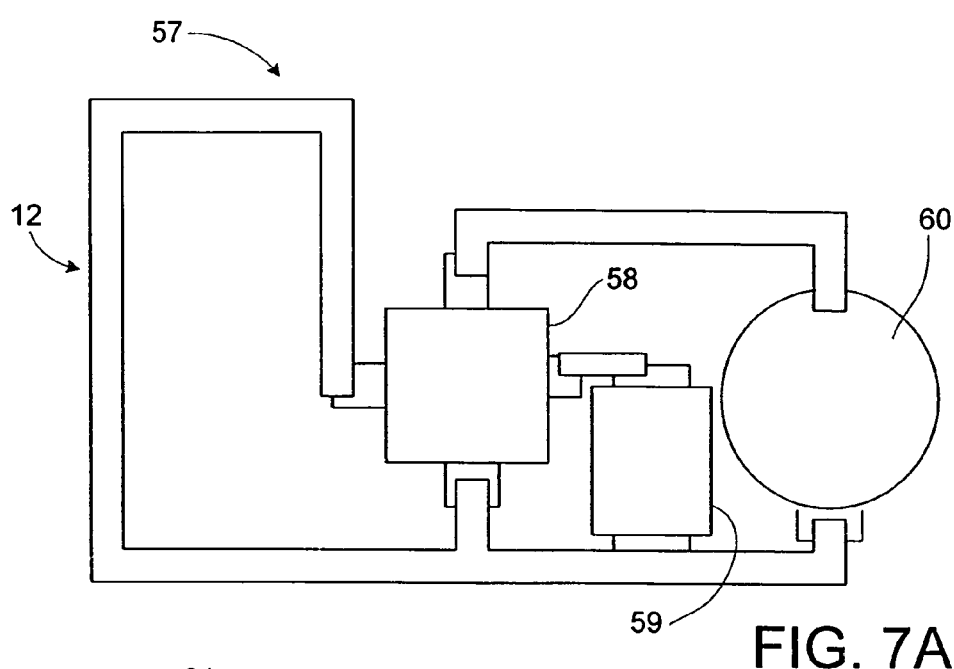
FIG. 7A is an oblique view illustrating an example of an active RFID device formed in accordance with the present invention.

An example of an active RFID device 57 is illustrated in FIG. 7A. The active RFID device 57 includes an RFID chip 58, a SAW resonator 59, and a battery 60. The conductive pattern 12 attached to the components of the active RFID device 57 may include an antenna, such as a simple loop antenna. The conductive pattern 12 may also include traces for suitably connecting the components 58-60 together.

Figure 7B:
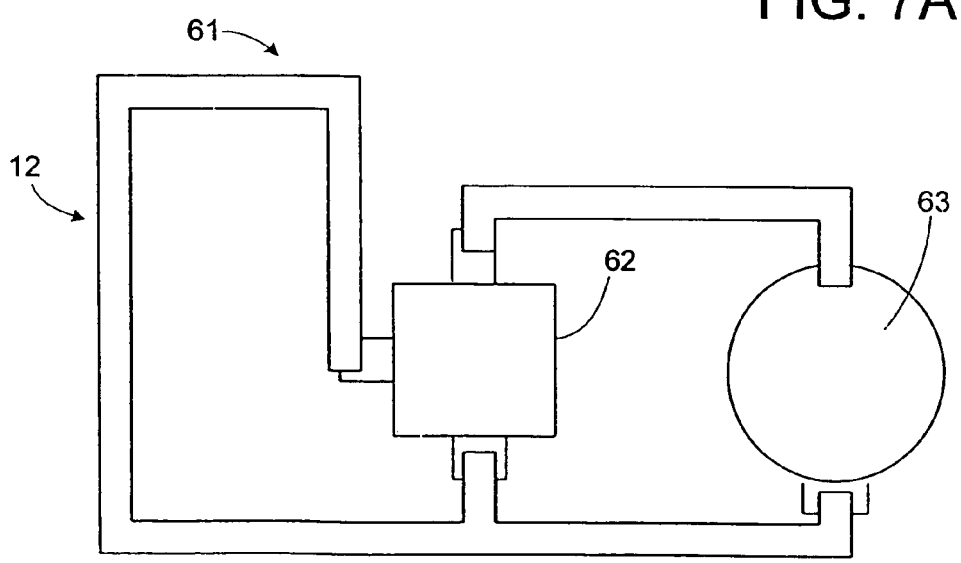
FIG. 7B is an oblique view illustrating an example of a semi-passive RFID device formed in accordance with the present invention.

Turning now to FIG. 7B, an example of a semi-passive RFID device 61 includes an RFID chip 62 and a battery 63 operatively coupled to the conductive pattern 12. As with the active RFID device 57 shown in FIG. 7A and described above, the conductive pattern 12 may include traces operatively coupling the components of the semi-passive device 61, in addition to including an antenna such as a loop antenna or an antenna with another configuration.

The batteries 60 and 63 may be traditional batteries, for example flexible thin-film batteries sold by Cymbet Corporation of Elk Ridge, Minn., USA, which are described further in International Publication WO 01/73864, which is hereby incorporated by reference in its entirety. Alternatively, the batteries 60 and 63 may be other sorts of devices for providing stored energy, such as printed super capacitors.

The batteries 60 and 63 may be configured so as to be de-activated until after the conductive pattern 12 is fabricated, thus avoiding shorting during fabrication processes, such as during the plating operation described below. Suitable methods of de-activation depend on the battery type. For zinc-air batteries a part of the finished RFID label or other structure may be removable, and when removed, such as by being torn off, may open an aperture and activate the battery. For lithium batteries, there may be a wax passivation inside the battery over the active materials, which is melted and removed when heat is applied.

In step 64 of the method 40, illustrated in FIG. 8, a conductive material is plated onto the patterned conductive ink layer 44 (FIG. 6) and the conductive substrate 18. The plating is done by a conventional electroplating operation using the conductive substrate 18 and the conductive ink layer 44 as one electrode of a system for forming a plating layer 66 by removing conductive material ions from a solution. The plating layer 66 may be any of a variety of suitable, platable, conductive materials. One example of such a suitable material is copper. Alternatively, an intrinsically conductive polymer may be used in place of copper plating. Examples of suitable intrinsically conductive polymers include PEDOT, PPy, and PANI. Plating a conductive polymer material may be done by an oxidative process, and may involve use of an oxidation-resistant conductive substrate.

The plating layer 66 includes a conductive pattern material portion 68 over the patterned conductive ink layer 44 (FIG. 6). In addition, dots or patches of an additional plated material portion 69 may form over the parts of the conductive substrate 18 not covered by the patterned conductive ink layer 44 (the un-inked parts 45 (FIG. 6) of the conductive substrate 18). In other words, plating may preferentially occur upon the patterned conductive ink layer 44. The preferential plating on the patterned conductive ink layer 44 results in a continuous plating layer only in the conductive pattern material portion 68. The additional plated material portion 69 may be substantially discontinuous, for example, being isolated dots or patches and/or being of insignificant thickness. The lack of continuous plated material in the un-inked parts 45 may advantageously reduce undesired electrical connections between parts of the conductive pattern material portion 68, thus possibly reducing the potential for electrically-induced damage to the electrical component 24. For carbon-based inks, copper may preferentially bond to the carbon in the ink at a faster rate than to the un-inked parts 45 of conductive substrate 18, such as un-inked portions of a smooth (e.g., polished) aluminum surface. Electroplated copper forms a matrix with carbon in the carbon-based inks, attaching the carbon and perhaps other components of the ink, to the copper that is formed by the plating. The carbon thus may act as a catalyst for plating of copper.

The thickness of the conductive pattern material portion 68 may be any of a wide variety of suitable thicknesses, depending on the application for the conductive pattern 12 (FIG. 2). For RFID antennas, thickness may be on the order of 18-30 microns for antennas used with 13.56 MHz systems, may be about 3 microns for antennas used with 900 MHz systems, and may be less than 3 microns for antennas used with 2.45 GHz systems. However, these thicknesses are merely examples, and it will be appreciated that conductive patterns 12 with a wide variety of other thicknesses may be employed.

It will be appreciated that electroplating does not occur on surfaces not covered by a conductive material. There may be a gap 70 in the plating layer 66 over all or part of the electrical component 24. This may be due to part of the electrical component 24 being made of a dielectric material, such as a non-conductive plastic housing. It will be appreciated that parts of the electrical component 24 may be covered with a dielectric material prior to or after placement on the conductive substrate 18 and/or the patterned conductive ink layers 44 (FIG. 6), to prevent plating thereupon.

By plating atop the conductive substrate 18, it will be appreciated that higher current densities may be employed, when compared to plating processes using conductive traces atop a dielectric substrate. In addition, the plating described herein may advantageously produce more uniform conductive patterns when compared to plating along thin conductive lines on dielectric substrates.

The conductive pattern material portion 68 of the plating layer 66 atop the patterned conductive ink layer 44 (FIG. 6) is a conductive pattern 12 having a pattern corresponding to that of the patterned conductive ink layer 44. Thus, the plating in step 64 results in formation of the conductive pattern 12, and the conductive pattern material portion 68 referred to hereafter as the conductive pattern 12.

As illustrated in FIG. 9, the plating in step 64 may serve to form conductive links 74 coupling the conductive pattern 12 to conductive leads of the electrical component 24, such as the conductive leads 54 of the RFID strap 50. In addition, the links may help physically secure the electrical component 24 to the conductive pattern 12.

In step 80, illustrated in FIG. 10, an adhesive layer 84 is deposited onto the plating layer 66. The adhesive layer 84 covers at least some of the conductive pattern 12, and may cover all of the conductive pattern 12. The adhesive layer 84 may optionally cover all of the plating layer 66. The adhesive layer 84 is used in separating the conductive pattern 12 from the conductive substrate 18. The adhesive layer 84 may be any of a variety of suitable adhesives, such as pressure-sensitive adhesive or other types of adhesives described above. The adhesive layer 84 may include a thermoset adhesive, an adhesive that is activated by heat.

The adhesive layer 84 may be deposited by printing or by other suitable means, such as depositing by use of a roller.

In step 90, a dielectric substrate or sheet 92 (FIG. 11) is laminated atop the conductive substrate 18, onto the adhesive layer 84. The dielectric substrate or sheet is also referred to herein as a separation substrate or layer. The dielectric substrate or sheet 92 is thus adhesively bonded, via the adhesive layer 84 to the conductive pattern 12. In step 94, the dielectric substrate 92, with the attached conductive pattern 12, is separated from the conductive substrate 18. In step 96, the conductive pattern 12 and the electrical component 24 may be processed further. For example, the conductive pattern 12 and the electrical component 24 may be transferred to an object other than the dielectric substrate 92. Alternatively, other components or layers may be formed onto or in conjunction with the conductive pattern 12, the electrical component 24, and/or the dielectric substrate 92. For example, a printable layer or a release sheet may be added to produce an RFID device such as a RFID tag or a RFID label.

A wide variety of processes may be utilized in the separation of the conductive pattern and the electrical component 24 from the conductive substrate 18. As one example, the dielectric substrate 92 may be a flexible material such as paper or polyester, and the adhesive layer 84 may be a pressure-sensitive adhesive. The dielectric substrate 92 may be pressed onto the adhesive layer 84 to join the dielectric substrate 92 to the conductive pattern 12. When the dielectric substrate 92 is peeled away from the conductive substrate 18, the conductive pattern 12 may have greater adherence to the dielectric substrate 92 than to the conductive substrate 18, causing the conductive pattern 12 and the electrical component 24 to peel away from the conductive substrate 18 as well. Alternatively, the dielectric substrate 92 may be a rigid material, with, for example, a flexible conductive substrate 18 peeled away from the dielectric substrate 92.

Although reference has been made to the substrate 92 as a dielectric substrate, it will be appreciated that all or parts of the substrate 92 may be partially or wholly an electrically conducting material. If part of the substrate 92 is electrically conducting, the substrate 92 may have a surface layer of a dielectric material, for example, to contact the conductive pattern 12 without undesirably electrically connecting various parts of the conductive pattern 12. Thus, the dielectric substrate 92 may be more broadly considered as a separation substrate, that is, as a substrate used in separating the conductive pattern 12 from the conductive substrate 18.

It will be appreciated that separation is facilitated by having the conductive pattern 12 be more adherent to the separation substrate 92 than to the conductive substrate 18, during the separation process. Thus, the adhesive layer 84 may have greater adherence to the conductive pattern 12 than the conductive pattern 12 has to the conductive substrate 18. As noted, the separation process may be proceeded by or may include changing of the adherence of the conductive ink layer 44 and/or the adhesive layer 84. Such changes may be accomplished by processes suitable to the adhesives, such as heating or pressure.

The separation substrate 92 and the conductive substrate 18 may be otherwise pulled from one another. In addition, the conductive pattern 12 may be removed from the conductive substrate 18 by use of other forces, for example, by use of a suitable magnetic force. As another alternative, high frequency ultrasonic forces may be used for separation. The ink layer 44, between two hard materials, the conductive pattern 12 and the conductive substrate 18, may be weakened by resonating the conductive substrate 18, for example, making the conductive pattern 12 more peelable from the conductive substrate 18.

Further variations on the above method are possible. For example, the adhesive layer 84, rather than being placed or deposited on the plating layer 66, may instead be printed or otherwise suitably deposited upon the dielectric layer 92. In addition, as suggested above, separation of the conductive pattern 12 from the conductive substrate 18 may involve additional steps, such as activating the adhesive layer 84 by heating or other suitable methods, and/or de-activation or weakening of an adhesive bond between the conductive ink layer 44 and the conductive substrate 18 and/or between the conductive ink layer 44 and the conductive pattern 12.

The conductive pattern 12 may include part or substantially all of the conductive ink layer 44. That is, the conductive ink of the conductive ink layer 44 may become embedded in or otherwise attached to the plated material of the conductive pattern 12. Alternatively, or in addition, all or part of the conductive ink layer 44 may form a residue which adheres to either or both the conductive substrate 18 and/or the plated material of the conductive pattern 12. It will be appreciated that such a residue may be removed, if desired, by a variety of suitable methods, including suitable washing and/or wiping processes, either of which may involve use of suitable solvents.

It will be appreciated that the electrical component 24 may be omitted entirely. Thus the conductive pattern 12 may be produced as a separate item. Such a separate conductive pattern 12 may be joined to the electrical component 24 in a later step, through use of suitable well-known processes. For example, soldering or conductive adhesives may be used to electrically connect the conductive pattern 12 to the electrical component 24 or other electrical components.

An alternative to soldering the electrical component 24 to the conductive pattern 12 is welding. Welding is advantageously accomplished while the conductive pattern 12 is adhered to the conductive substrate 18, in that the weld current will tend to flow vertically down through the conductive pattern 12 and into the conductive substrate 18. Any induced voltage may thus be shorted by the conductive substrate 18, reducing or eliminating the potential for electrical-induced damage to the electrical component 24.

The soldering, welding, or connection with a conductive adhesive, between the conductive pattern 12 and the electrical component 24, may occur before removal of the conductive pattern 12 from the conductive substrate, or alternatively, after the removal. However, it will be appreciated that the conductive pattern 12 may be a separate article requiring no connection to an electrical component. For example, the conductive pattern 12 may be used separately as a decorative or other visually-distinctive item, wholly apart from the conductive nature of the material.

It will be appreciated that a wide variety of electrically-conductive patterns may be formed using the method 40 described above. As noted already, two possible uses for such conductive patterns are as decorative elements and as antennas for RFID devices. Another possible application for the method is in production of circuit cables or printed circuit boards, such as those used to couple together electronic devices. Such cables often require fine-resolution, flexible arrays of conductive elements, mounted on a plastic or other flexible substrate. In making such arrays, the dielectric or separation substrate 92 may be a flexible plastic such as polyester, polyethylene terephthalate (PET), polypropylene or other polyolefins, polycarbonate, or polysulfone.

FIG. 12 is a flowchart illustrating a method 100, an alternative embodiment of the method 10, that involves placing a patterned dielectric layer on the conductive substrate. In step 102, illustrated in FIG. 13, a patterned dielectric mask 108 is placed on the conductive substrate 18. The dielectric mask has one or more openings 110 corresponding to desired locations for forming portions of the conductive pattern 12. The dielectric mask 108 covers portions of the conductive substrate 18, to prevent plating of the covered portions.

The dielectric mask 108 may be any of a variety of suitable materials. According to one embodiment of the invention a dielectric material may be printed in the desired pattern on the conductive substrate 18. A variety of suitable printing methods may be used to print the dielectric mask 108. One example of a suitable dielectric material is a UV-curable material, catalog number ML-25198, available from Acheson Colloids, of Port Huron, Mich., U.S.A.

Alternatively, the dielectric mask 108 may be a pre-formed solid mask that is placed upon the conductive substrate 18. The pre-formed dielectric mask may be a rubber or polymer mask having the openings 110 formed therein. In addition, inorganic materials, such as electrically-insulating enamel, may be used in the dielectric mask 108.

It will be appreciated that other suitable, well-known methods may be used for forming a suitable dielectric mask 108.

Figure 14:
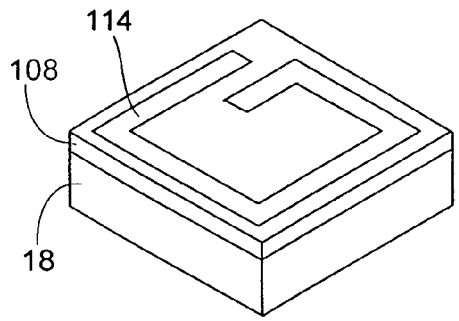
FIG. 14 is an oblique view illustrating a second step of the method of FIG. 12.

In step 112, a patterned conductive ink layer 114, shown in FIG. 14, is deposited into the openings 110 of the dielectric mask 108. The conductive ink may be similar to the types of conductive ink discussed above with regard to the patterned conductive ink layer 44 (FIG. 5). The conductive ink layer 114 may be deposited by printing or by other suitable methods, such as blade coating.

Figure 15:
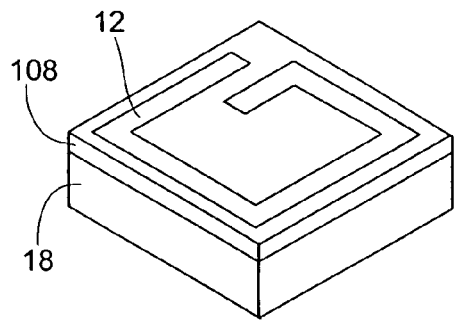
FIG. 15 is an oblique view illustrating a third step of the method of FIG. 12.

In step 118, electroplating is used to form the conductive pattern 12, as illustrated in FIG. 15. The plating process may be similar to that described above with regard to step 64 of the method 40. The exposed surfaces of the dielectric mask 108 will generally not be plated during the plating process, as the plating is confined to exposed portions which conduct electricity from the conductive substrate 18.

Figure 16:
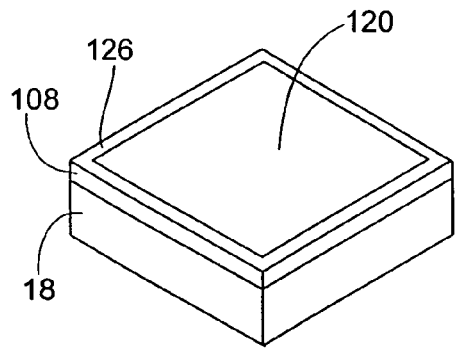
FIG. 16 is an oblique view illustrating a fourth step of the method of FIG. 12.

As illustrated in FIG. 16, an adhesive layer 120 is then deposited onto the conductive pattern 12, in step 124. The materials and method of deposit for the adhesive layer 120 may be similar to those for the adhesive layer 84 (FIG. 10). The adhesive layer 120 may be deposited such that it leaves portions 126 of the dielectric mask 108 substantially free of adhesive.

Following placement of the adhesive layer 120 a separation or dielectric feed is laminated onto the adhesive layer in step 130, and the conductive pattern 12 is separated from the conductive substrate 18 in step 140. Details of these steps may be similar to those of the corresponding steps of the method 40 (FIG. 4). The dielectric mask 108 may be attached to the conductive substrate 18 such that it remains attached to the conductive substrate 18 even as the conductive pattern 12 is peeled off or otherwise separated from the conductive substrate 18. This may be due to strong adherence between the dielectric mask 108 and the conductive substrate 18. Alternatively, the separation of the conductive pattern 12, and not the dielectric substrate 108, may be due to a relatively weak adhesion between the dielectric mask 108 and the separation or dielectric substrate. An adhesive may be utilized in attaching the dielectric mask 108 to the conductive substrate 18.

Figure 17:
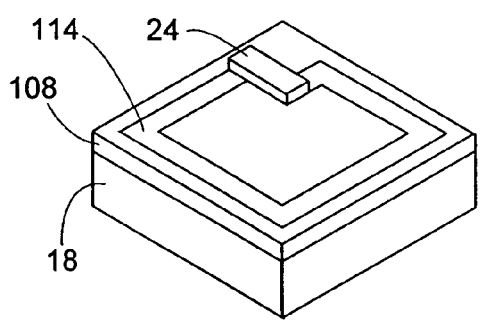
FIG. 17 is an oblique view illustrating a step in an alternate embodiment of the method of FIG. 12.

The method 100 described above may be modified by placing the electrical component 24 in a suitable location on the conductive ink 114 prior to plating, as is illustrated in FIG. 17. The electrical element 24 may be placed before the conductive ink 114 is dried, thereby adhering it to the conductive ink 114 on drying. Alternatively, a suitable adhesive may be used to adhere the electrical element 24 to the conductive ink 114. It will be appreciated that other steps of the method 100 may be carried out in a similar manner to that described above.

As another alternative, the conductive ink 114 may be omitted entirely, with the plating involving plating material directly on the conductive substrate 18 through the openings 110. Materials for the plating and for the conductive substrate 18, as well as other materials involved, may be selected such that the material directly plated on the conductive substrate 18 is able to be separated from the conductive substrate 18, thereby forming a separate conductive pattern.

It will be appreciated that some of the steps in the methods 40 and 100 may be varied or performed in an order different from that described above. For example, in the method 100, the conductive ink may be placed prior to the placement of the patterned dielectric layer. For example, the conductive ink may be a uniform layer on the conductive substrate 18 with the dielectric mask 108 relied upon to prevent plating except where desired for formation of the conductive pattern 12. Alternatively, the placement of the conductive ink on the conductive substrate 18 may be a patterned placement, with the dielectric mask 108 may be then formed to, for example, "fine tune" resolution of the conductive pattern 12. Also, by placing the dielectric mask 108 over areas of the conductive substrate 18 that do not correspond to the conductive pattern 12, plating is concentrated toward areas where the conductive pattern 12 is to be formed, thus reducing material consumption and cost.

Although the dielectric mask 108 has been described above as being adhered to the conductive substrate 18 during the separation of the conductive pattern 12 from the conductive substrate 18, it will be appreciated that other alternatives may be possible. For example, the dielectric mask 108 may be separated from the conductive substrate 18 at the same time that the conductive pattern 12 is separated from the conductive substrate 18. The dielectric mask 108 may then be separated from the conductive pattern 12, or alternatively, left to remain connected to the conductive pattern 12. As another alternative, the dielectric mask 108 may be separately removed, for example, with a solvent, after the electroplating and prior to or after separation of the conductive pattern 12 from the conductive substrate 18.

Figure 18:
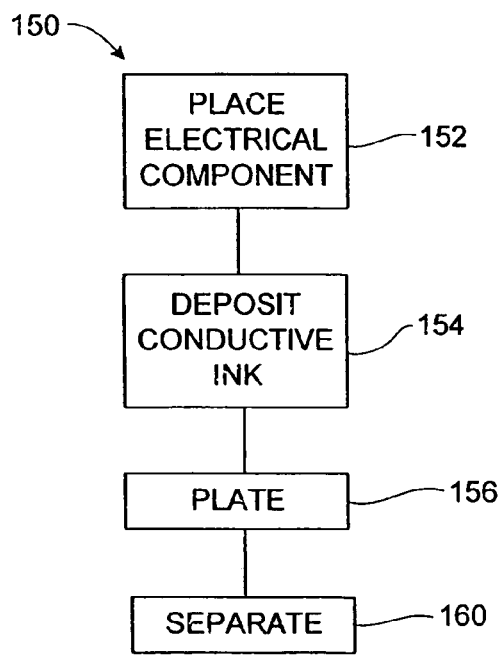
FIG. 18 is a flowchart illustrating yet another example of the method of FIGS. 1 and 3.
Figure 19:
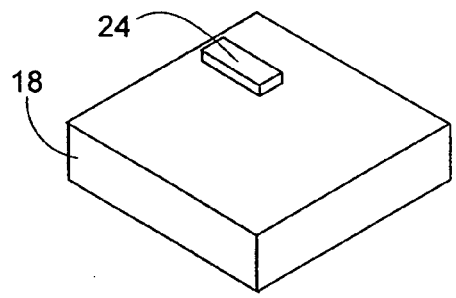
FIG. 19 is an oblique view illustrating a first step of the method of FIG. 18.

FIG. 18 is a flow chart of another alternate method, a method 150 for fabricating the conductive pattern 12 in connection with the electrical component 24. In step 152, illustrated in FIG. 19, the electrical component 24 is placed on the conductive substrate 18. The electrical component is placed in a "face-up" configuration, such that the connection points for linking the conductive pattern 12 to the electrical component 24 are exposed. For example, if the electrical component 24 is an RFID strap 50 (FIG. 7), the strap 50 may be placed with its conductive leads 54 uncovered and facing upward.

The electrical component 24 may be secured to the conductive substrate by use of a suitable adhesive, or by other suitable means. Also, the electrical component 24 may be placed in a depression in the conductive substrate 18 by fluidic self assembly methods. Further description regarding such methods may be U.S. Pat. Nos. 5,783,856, 5,824,186, 5,904,545, 5,545,291, 6,274,508, 6,281,038, 6,291,896, 6,316,278, 6,380,729, and 6,417,025, all of which are hereby incorporated by reference in their entireties.

Figure 20:
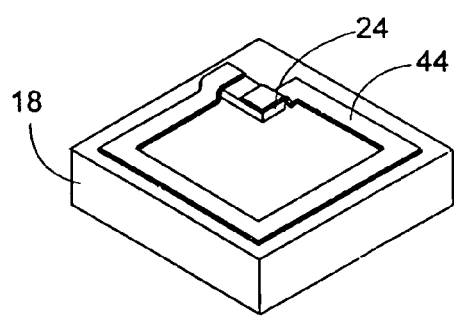
FIG. 20 is an oblique view illustrating a second step of the method of FIG. 18.

In step 154, illustrated in FIG. 20, the patterned conductive ink layer 44 is printed or otherwise deposited. Parts of the conductive ink layer 44 may cover parts of the electrical component 24, thereby assuring good contact between the electrical component 24 and the subsequently-formed conductive pattern 12. For example, parts of the conductive ink layer 44 may cover parts of the conductive leads 54 that are parts of the RFID device 50 that may be utilized as the electrical component 24.

In step 156, illustrated in FIG. 21, electroplating is performed to form the plating layer 66. The conductive pattern material portion 68 over the patterned conductive ink layer 44 includes conductive links 74 providing electrical connection between the electrical component 24 and the conductive pattern 12. In addition, the conductive links 74 may include portions plated directly on contacts of the electrical component 24, such as directly on parts of the conductive leads 54 of the RFID device 50. The continuity of plated material from the conductive pattern 12, through the conductive links 74, to parts of the electrical component 24, provides strong electrical and mechanical coupling between the conductive pattern 12 and the electrical component 12.

Finally in step 160 the conductive pattern 12 and the electrical component 24 are separated from the conductive substrate 18. The separation process may be similar to separation processes discussed in detail with regard to other methods discussed above.

It will be appreciated that the method 150 may be suitably modified to employ a dielectric layer such as the dielectric layer 108 (FIG. 13) utilized in the method 100 (FIG. 12).

The methods described above may be performed in one or more roll-to-roll operations wherein a system 200 for performing such an operation is schematically illustrated in FIG. 22. The below description is only an overview, and further details regarding roll-to-roll fabrication processes may be found in U.S. Pat. No. 6,451,154, which is hereby incorporated by reference in its entirety.

The conductive substrate material 18 moves from a conductive substrate supply roll 202 to a conductive substrate take-up roll 204. A conductive ink printer 208 is used to print the patterned conductive ink layer 44 on the conductive substrate 18. The electrical component 24 is then placed in contact with the conductive ink layer 44 at a placement station 212. As shown in FIG. 22, the electrical components 24 are located on a web 216 of material, for example, being lightly adhesively coupled to the web 216. The web proceeds from a web supply roll 218 to a web take-up roll 220. A pair of press rollers 224 and 226 press the web 216 down toward the conductive substrate 18, bringing the electrical component 24 into contact with the patterned conductive ink layer 44. As described above with regard to the method 40, the electrical component 24 may be adhesively coupled to the conductive ink layer 44, and separated from the web 216.

It will be appreciated that the placement station 212 may alternatively have other sorts of devices for placing the electrical components 24 onto the patterned conductive ink layer 44. For example, the placement station 212 may include one or more pick-and-place devices and/or rotary placers. Examples of pick-and-place devices include the devices disclosed in U.S. Pat. Nos. 6,145,901, and 5,564,888, both of which are incorporated herein by reference, as well as the prior art devices that are discussed in those patents. An example of a rotary placer is disclosed in U.S. Pat. No. 5,153,983, the disclosure of which is incorporated herein by reference.

After placement of the electrical components 24, the conductive ink layer may be suitably dried at a drying station 228, for example by suitably heating the conductive substrate 18 and its surroundings.

The conductive substrate 18 thereafter moves into and through a plating bath 230, in which the electroplating occurs. It will be appreciated that the plating bath 230 may be configured so that each part of the conductive substrate 18 has a sufficient residence time so as to form a plating layer 66 of the desired thickness. The conductive substrate 18 is guided through the plating bath 230 by rollers 232, 234, and 236.

An adhesive printer 240 is then used to print the adhesive layer 84 atop the plating layer 66. The adhesive layer 84 may be dried at a drying station 242.

Finally, separation of the conductive pattern 12 from the conductive substrate 18 is accomplished at a separation station 250. A separation substrate 92 moves from a separation substrate supply roll 252 to a separation substrate take-up roll 254. A pair of press rollers 256 and 258 press the separation substrate onto the adhesive layers 84, thereby adding the separation substrate 92 to the laminate based on the conductive substrate 18. The separation substrate 92 is pulled away from the conductive substrate 18 and towards the separation substrate take-up roll 254. As discussed above, the conductive pattern 12 and the electrical component 24 preferentially adhere to the separation substrate 92, and are pulled off the conductive substrate 18.

It will be appreciated that other operations may be performed, such as cleaning of the conductive substrate 18, which may then be re-used.

As alternatives to the roll-to-roll operation shown and described, the conductive substrate 18 may be part of a continuous loop of material, or a rotating drum of material, enabling the conductive substrate 18 to be continuously re-used.

The roll-to-roll operation illustrated in FIG. 22 and described above is but one example of a range of suitable operations. Alternatively, the method 10 may involve multiple roll-to-roll operations, as well as operations that are not performed in a roll-to-roll manner.

FIG. 23 illustrates one possible configuration for the conductive pattern 12, an antenna 300 coupled to an RFID strap 50 to produce an RFID device 302. FIG. 24 shows another possible antenna configuration, an antenna 310 that is part of an RFID device 312. FIG. 25 shows yet another possible antenna configuration, an antenna 320 that is part of an RFID device 322.

It will be appreciated that the antennas shown in FIGS. 23-25 may alternatively be coupled to suitable electronics for forming other types of RFID devices, such as active or semi-passive RFID devices. Examples of such devices are shown in FIGS. 7A and 7B, and are discussed above.

Figure 26:
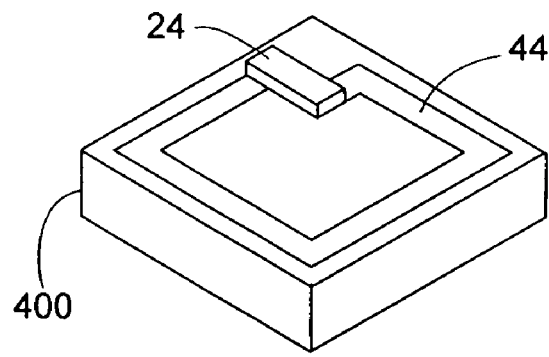
FIGS. 26 and 27 are oblique views illustrating another method in accordance with the present invention.
Figure 27:
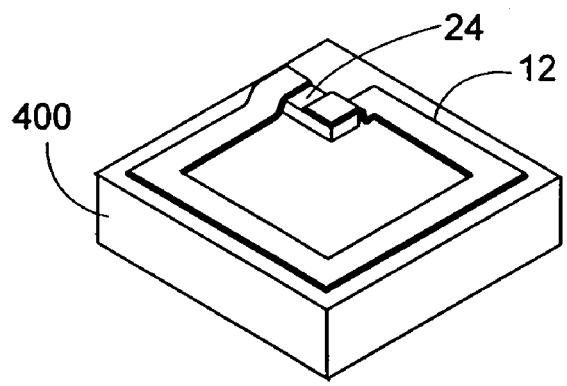

FIGS. 26 and 27 illustrate another embodiment, utilizing a non-conductive substrate. Referring to FIG. 26, the conductive ink layer 44 may be deposited on a non-conductive substrate 400. An electrical component 24 may be placed on and in contact with the conductive ink layer 44. The non-conductive substrate 400 may include plastic or another suitable material.

The conductive ink layer 44 may include portions electrically coupling together various of the portions where plating is desired, to thereby facilitate plating. It will be appreciated that different parts of the conductive ink layer 44 may include different types of ink. For example, portions of the layer 44 where plating is desired may include an ink that preferentially encourages plating, when compared with other areas of the conductive ink layer 44 where plating is not desired. Alternatively, portions of the conductive pattern 12 to be formed may have a lower adherence to the non-conductive substrate 400 than the adherence of other portions of the conductive ink layer 44.

Turning now to FIG. 27, electroplating may be used to form the conductive pattern 12 atop the non-conductive substrate 400, including forming conductive links with the electrical component 24. Following the electroplating, the conductive pattern 12 and the electrical component 24 may be separated from the non-conductive substrate, for example using an adhesive to peel the conductive pattern 12 and electrical component 24 from the non-conductive substrate 400.

Figure 28:
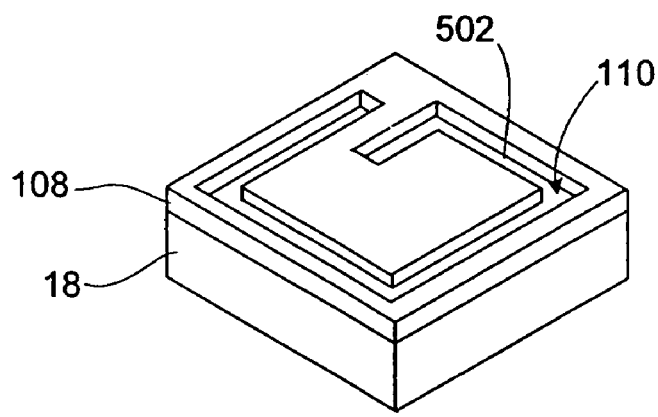
FIG. 28 is an oblique view illustrating yet another method in accordance with the invention.

FIG. 28 illustrates yet another embodiment of the invention, where a dielectric layer or mask 108 covers parts of a conductive substrate 18. The mask also has openings 110 therein, leaving parts 502 of the conductive substrate 18 uncovered. Electroplating is then performed to form a conductive pattern 12, such as that shown in FIG. 2, on the un-inked, uncovered parts 502 of the conductive substrate 18. The conductive pattern 12 may then be separated from the conductive substrate 18.

The conductive substrate 18 may have a roughened surface at least on the parts 502 upon which the conductive pattern 12 is formed. The surface roughness may provide faster plating of the conductive pattern 12. An example of a suitable roughening method for aluminum is rubbing the aluminum surface with 320 grit sandpaper.

A thin layer of a suitable material, such as oil, may be placed on the otherwise-uncovered parts 502, prior to the plating of the conductive pattern 12, to facilitate subsequent separation of the conductive pattern 12 from the conductive substrate 18.

As an alternative to the method described with regard to FIG. 28, it may be possible to dispense with the need for the dielectric layer or mask 108, by selectively roughening the parts 502 of the conductive substrate 18 upon which formation of the conductive patter 12 is desired. As already mentioned above, electroplating may preferentially occur on the roughened surface. That is, electroplated material may be deposited at a faster rate on a rough or roughened surface, as compared with a smooth surface. The difference between rougher and smoother surface in growth rates and/or adherence may be sufficient to allow suitable selective plating and separation of the conductive pattern 12, without use of the mask 108

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A radio frequency identification (RFID) device comprising:
   an RFID chip;
   an RFID antenna; and
   electroplated conductive links providing electrical coupling between the chip and the antenna;
   wherein the antenna includes electroplated material that is substantially continuous with the conductive links;

wherein the chip is part of an RFID strap which includes conductive leads coupled to the chip;

wherein the conductive links are in contact with the conductive leads; and wherein there is conductive ink between the conductive links and parts of the conductive leads.

2. The device of claim 1, wherein the antenna includes carbon.

3. The device of claim 2, wherein the carbon is at least part of a carbon-containing ink.

4. The device of claim 1, wherein the RFID strap includes an insulating strap substrate; and wherein the conductive links extend along sides of the insulating strap substrate.

5. The device of claim 4, wherein the insulating strap substrate is between the conductive leads and the antenna.

6. A radio frequency identification (RFID) device comprising:

an RFID chip;

an RFID antenna; and electroplated conductive links providing electrical coupling between the chip and the antenna;

wherein the chip is part of an RFID strap which includes conductive leads coupled to the chip;

wherein the strap includes an insulating strap substrate between the conductive leads and the antenna;

wherein the conductive links are in contact with the conductive leads; and wherein the antenna includes electroplated material that is substantially continuous with the conductive links.

7. The device of claim 6, wherein the antenna also includes a conductive ink layer.

8. The device of claim 7, wherein the conductive ink layer includes a carbon-containing ink.

9. The device of claim 7, wherein the electroplated conductive links and the electroplated material of the antenna, both include copper.

10. The device of claim 6, wherein the antenna and the conductive links include copper.

11. The device of claim 6, wherein the conductive links extend along sides of the insulating strap substrate.

12. A radio frequency identification (RFID) device comprising:

an RFID chip;

an RFID antenna;

electroplated conductive links providing electrical coupling between the chip and the antenna; and an energy storage device electrically coupled to the chip;

wherein the antenna includes electroplated material that is substantially continuous with the conductive links; and wherein the electroplated material includes connections with the energy storage device.

13. The device of claim 12, wherein the energy storage device includes a battery.

14. The device of claim 12, further comprising a resonator electrically connected to the chip.

15. A radio frequency identification (RFID) device comprising:

an RFID chip;

an RFID antenna;

electroplated conductive links providing electrical coupling between the chip and the antenna; and conductive leads that are electrically coupled to the chip;

wherein the conductive links are in contact with surfaces of the conductive leads that face away from the antenna;

wherein the chip and the conductive leads are parts of an RFID strap;

wherein the strap includes an insulating substrate between the conductive leads and the plane of the antenna;

wherein the antenna is a planar antenna;

wherein the conductive links extend out of a plane of the antenna; and wherein the conductive links extend along the insulating strap substrate where the conductive links extend out of the plane of the antenna.

16. The device of claim 15, wherein the planar antenna is a loop antenna.

17. The device of claim 15, wherein the conductive links extend substantially perpendicular to the plane of the antenna.

* * * * *